United States Patent
Dai et al.

(10) Patent No.: US 11,965,929 B2
(45) Date of Patent: Apr. 23, 2024

(54) METHOD AND SYSTEM FOR DETECTING GLITCH AT HIGH SAMPLING RATE

(71) Applicant: UESTC (Shenzhen) Advanced Research Institute, Shenzhen (CN)

(72) Inventors: Zhijian Dai, Shenzhen (CN); Wanyu Yang, Shenzhen (CN); Jian Wu, Shenzhen (CN)

(73) Assignee: UESTC (Shenzhen) Advanced Research Institute, Shenzhen (CN)

( * ) Notice: Subject to any disclaimer, the term of this patent is extended or adjusted under 35 U.S.C. 154(b) by 9 days.

(21) Appl. No.: 17/810,668

(22) Filed: Jul. 5, 2022

(65) Prior Publication Data

US 2023/0061075 A1 Mar. 2, 2023

(30) Foreign Application Priority Data

Aug. 27, 2021 (CN) .......................... 202110996836.1

(51) Int. Cl.
*G01R 31/317* (2006.01)
*G01R 31/3177* (2006.01)

(52) U.S. Cl.
CPC . *G01R 31/31708* (2013.01); *G01R 31/31703* (2013.01); *G01R 31/31725* (2013.01); *G01R 31/3177* (2013.01)

(58) Field of Classification Search
CPC ........ G01R 31/31709; G01R 31/31708; G01R 31/31703; G01R 31/31725; G01R 31/3177; G01N 21/88
See application file for complete search history.

(56) References Cited

U.S. PATENT DOCUMENTS

| | | | | |
|---|---|---|---|---|
| 4,495,621 A * | 1/1985 | Nakagomi | ............. | G01R 13/30 714/724 |
| 2003/0095619 A1 * | 5/2003 | Vallet | .................... | H04L 25/069 375/355 |
| 2006/0217919 A1 * | 9/2006 | Sotiriou | ............. | G01R 31/3016 702/125 |
| 2007/0057697 A1 * | 3/2007 | Boerstler | ......... | G01R 31/31725 327/34 |
| 2011/0175758 A1 * | 7/2011 | Iqbal | .................... | H03K 5/1252 341/94 |

* cited by examiner

*Primary Examiner* — Jean B Corrielus
(74) *Attorney, Agent, or Firm* — AVEK IP, LLC

(57) ABSTRACT

Methods for detecting a glitch at a high sampling rate are provided. In some embodiments, a method includes the following steps: S1, acquiring to-be-identified data; S2, processing the to-be-identified data to obtain normal sampling data; and S3, performing glitch identification on the to-be-identified data to obtain a glitch position of the normal sampling data. In other embodiments, the disclosure provides a system for detecting a glitch at a high sampling rate and for implementing the method for detecting a glitch at a high sampling rate. The system includes an acquisition unit and a glitch identification unit. The acquisition unit acquires and processes the to-be-identified data to obtain the normal sampling data, and the glitch identification unit performs glitch identification on the to-be-identified data to obtain the glitch position of the normal sampling data.

13 Claims, 4 Drawing Sheets

METHOD AND SYSTEM FOR DETECTING GLITCH AT HIGH SAMPLING RATE

CROSS REFERENCE TO RELATED APPLICATIONS

This patent application claims the benefit and priority of Chinese Patent Application No. 202110996836.1, filed on Aug. 27, 2021, the disclosure of which is incorporated by reference herein in its entirety.

FIELD OF THE DISCLOSURE

The disclosure relates generally to the field of data domain testing. More specifically, the disclosure relates to methods and systems for detecting a glitch at a high sampling rate.

BACKGROUND

With the rapid development of semiconductor technologies, modern digital systems usually work at an increasingly high frequency, a signal is required to be set up and held in a shorter time, and a glitch on the signal may cause other units of the system to incorrectly respond. Therefore, it is extremely urgent to accurately and quickly implement glitch detection, and a higher requirement is put forward on the field of data domain testing.

To better test and analyze digital circuits, a logic analyzer, as a data domain test instrument, needs to have better glitch detection capability. According to a definition of a glitch signal, a pulse whose width is less than a current sampling interval is a glitch. A user sets a system sampling rate based on an actual need. The system internally identifies normal sampling data and a glitch position at the sampling rate, and displays the normal sampling data and the glitch position on an interface.

At present, the design principle of the glitch detection performed by the logic analyzer is generally as follows: a trigger acquires a signal in a high-speed timing clock, and counts pulses at the same time, and when the quantity of the pulses is less than a certain value, the signal is marked as a glitch and displayed on the interface.

However, as an operating frequency of a digital system gets increasingly fast, a pulse width of a glitch pulse becomes increasingly narrow. Due to limitation of the operating clock of the trigger, the detection of a picosecond-level pulse width cannot be implemented.

SUMMARY

The following presents a simplified summary of the invention in order to provide a basic understanding of some aspects of the invention. This summary is not an extensive overview of the invention. It is not intended to identify critical elements or to delineate the scope of the invention. Its sole purpose is to present some concepts of the invention in a simplified form as a prelude to the more detailed description that is presented elsewhere.

In some embodiments, the disclosure provides a method for detecting a glitch at a high sampling rate. The method includes the following three steps: S1, acquiring to-be-identified data; S2, processing the to-be-identified data to obtain normal sampling data; and S3, performing glitch identification on the to-be-identified data to obtain a glitch position of the normal sampling data.

Optionally, S2 includes performing equal-interval extraction on the to-be-identified data based on a timing analysis rate to obtain the normal sampling data.

Optionally, S3 includes the following two steps.

S301, performing end-to-end splicing on the to-be-identified data at a previous sampling moment of a current sampling moment, the to-be-identified data at the current sampling moment, and the to-be-identified data at a next sampling moment of the current sampling moment to obtain spliced data.

S302, extracting transition edge position data based on the spliced data and a quantity of interval of the equal-interval extraction, and identifying a glitch based on the transition edge position data.

Optionally, when the step S301 is performed, only a last bit of the to-be-identified data at the previous sampling moment of the current sampling moment is taken, and first the quantity of interval of the equal-interval extraction minus one bits of the to-be-identified data at the next sampling moment of the current sampling moment is taken.

Optionally, S302 includes: (1) calculating and extracting the transition edge position data based on the spliced data; and (2) determining, based on the transition edge position data, whether a position difference between two adjacent transition edges is less than the quantity of interval of the equal-interval extraction. If the position difference between the two adjacent transition edges is less than the quantity of interval of the equal-interval extraction, the glitch appears at a corresponding position of the normal sampling data, and the glitch is subject to a first transition edge position of a glitch pulse; and otherwise, no glitch appears at the corresponding position of the normal sampling data.

Optionally, in step (1), pairwise exclusive OR operation shown in the following formula is performed on adjacent bits of the spliced data to obtain the transition edge position data: Edge [i]=Data_com [i]⊕Data_com [i+1]. Here, Edge [i] represents a set of the transition edge position data, Edge [i] being 1 represents that a transition edge appears at the corresponding position of the normal sampling data, and Edge [i] being 0 represents that no transition edge appears at the corresponding position of the normal sampling data; Datacom [i] represents [i]-th bit of a set of the spliced data; and Datacom [i+1] represents [i+1]-th bit of the set of the spliced data.

Optionally, in step (2), the step of determining whether the position difference between two adjacent transition edges is less than the quantity of interval of the equal-interval extraction is conducted by using a determining criterion such that any one group of data among Edge [0+k×m+m−1:0+k×m], Edge [1+k×m+m−1:1+k×m], Edge [2+k×m+m−1:2+k×m], Edge [m−1+k×m+m−1:m−1+k×m] among the transition edge position data Edge [i] has two is and a lowest bit in the group of data is 1, wherein m is the quantity of interval of the equal-interval extraction and k is an integer selected from the group consisting of 0, 1, 2, . . . .

Optionally, S1 includes: S101, performing time-interleaved sampling on a data channel of the to-be-identified data by two acquisition units to obtain two groups of to-be-detected data; and S102, performing alternative splicing on the two groups of the to-be-detected data to obtain the to-be-identified data.

Optionally, the two acquisition units include a first acquisition unit and a second acquisition unit; and a QUAD phase of a reference clock of the second acquisition unit is greater than that of the first acquisition unit by 180°.

BRIEF DESCRIPTION OF THE DRAWINGS

Illustrative embodiments of the present disclosure are described in detail below with reference to the figures.

DETAILED DESCRIPTION

The following describes some non-limiting embodiments of the invention with reference to the accompanying drawings. The described embodiments are merely a part rather than all of the embodiments of the invention. All other embodiments obtained by a person of ordinary skill in the art based on the embodiments of the disclosure shall fall within the scope of the disclosure.

The implementations of the present disclosure are described below by using specific instances, and those skilled in the art can easily understand other advantages and effects of the present disclosure from the content disclosed in this specification. The present disclosure can further be implemented or applied by using other different specific implementations. Based on different viewpoints and applications, various modifications or amendments can be made to various details of this specification without departing from the spirit of the present disclosure. It should be noted that the embodiments and the features of the embodiments may be combined with each other without conflict.

It should be noted that the drawings provided in the following embodiments are only used to illustrate the basic concept of the present disclosure in a schematic way. Therefore, the drawings only show the components related to the present disclosure rather than the quantity, shape, and size of components during actual implementation. The pattern, quantity, and proportion of each component can be changed at will during actual implementation, and the layout and the pattern of the components may also be more complicated.

Embodiment I

Figure 1:
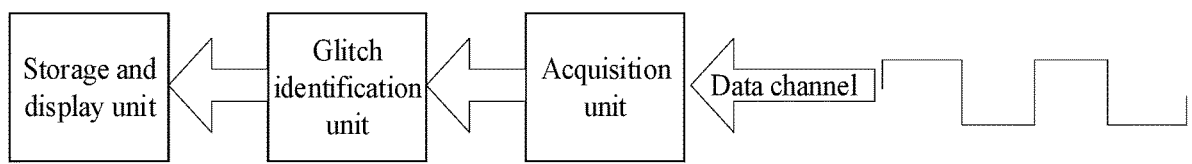
FIG. 1 is a block diagram of implementing glitch detection according to an embodiment of the disclosure.
Figure 2:
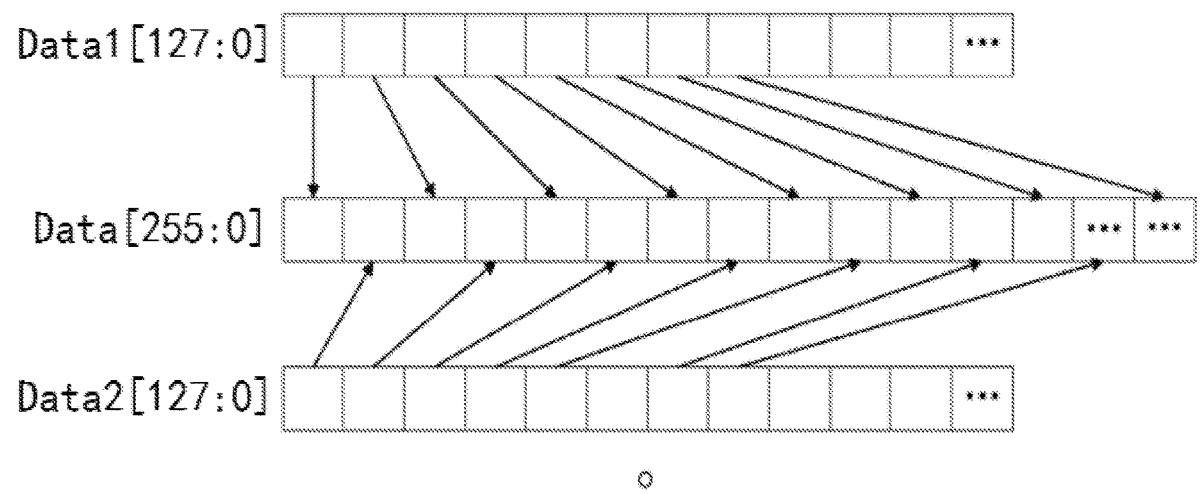
FIG. 2 is schematic diagram of alternative splicing according to an embodiment of the disclosure.
Figure 3:
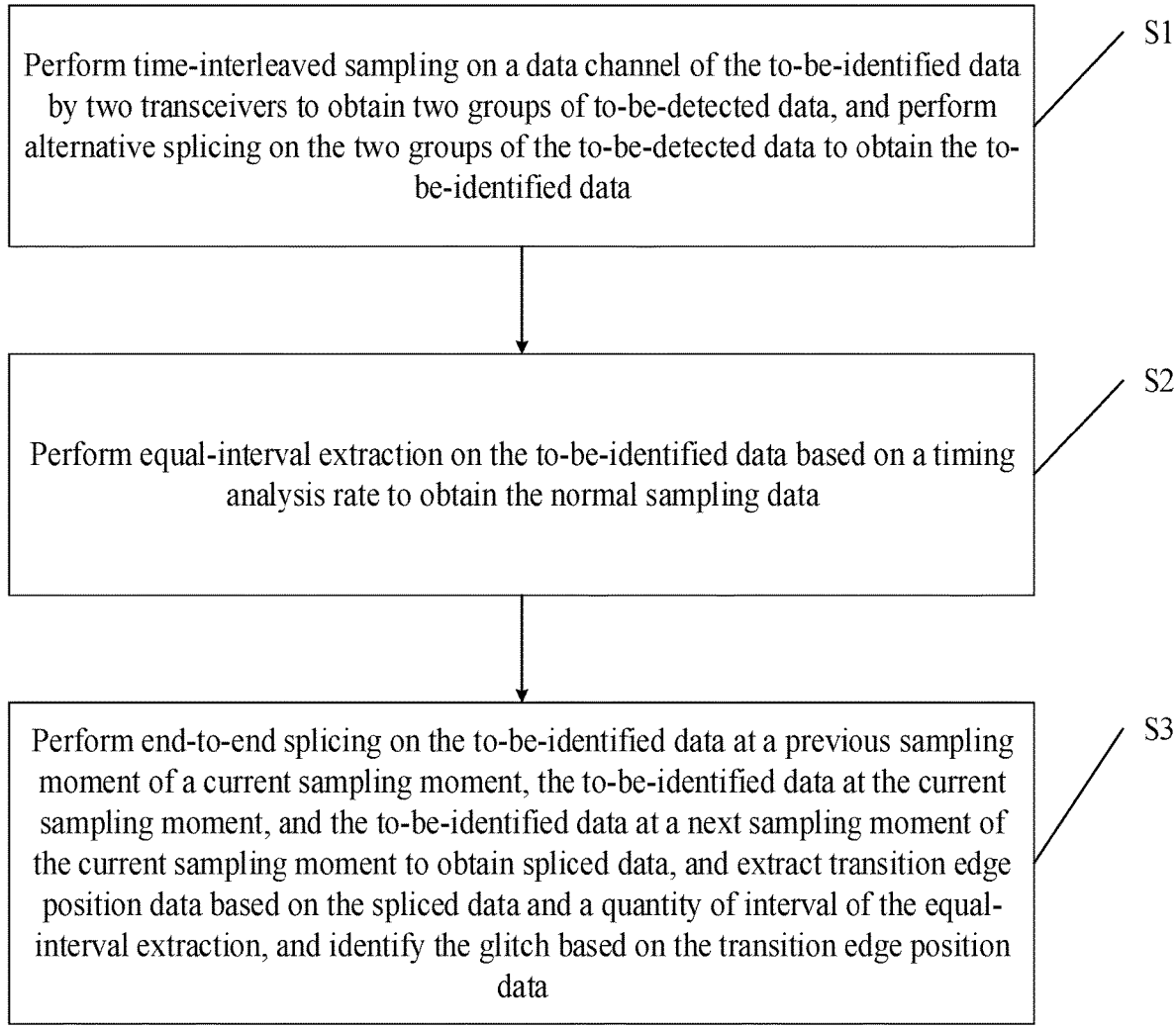
FIG. 3 is a flow diagram of a method for detecting a glitch at a high sampling rate according to an embodiment of the disclosure.

As shown in FIGS. 1 through 3, a method for detecting a glitch at a high sampling rate is provided, including steps S1-S4:

S1 To-be-identified data are acquired.

S101 Time-interleaved sampling on a data channel of the to-be-identified data is performed by two acquisition units, to obtain two groups of the to-be-detected data.

In this embodiment, a high-speed transceiver inside an FPGA is used as an acquisition unit. A GTY transceiver may convert a high-speed serial signal into a low-speed parallel signal, to implement a sampling rate of 25 Gbps. At this time, a data bit width is 128 bits.

The acquisition unit includes a first acquisition unit and a second acquisition unit, and a QUAD phase of a reference clock of the second acquisition unit is greater than a QUAD phase of a reference clock of the first acquisition unit by 180°.

The QUAD phase of the reference clock of the first acquisition unit is 0°, and the QUAD phase of the reference clock of the second acquisition unit is 180°.

By giving two acquisition units (i.e. two high-speed transceivers) different reference clocks with a QUAD phase difference of 180°, a sampling rate of 25 gigabit samples per second (GSPS) with a phase difference of 180° between two phases may be implemented, that is, time-interleaved sampling.

A group of the to-be-detected data acquired by the first acquisition unit is represented as Data1 [127:0], an acquisition rate is 25 GSPS, and the data bit width is 128 bits. A group of the to-be-detected data acquired by the second acquisition unit is represented as Data2 [127:0], the acquisition rate is 25 GSPS, and the data bit width is 128 bits.

S102 Alternative splicing is performed on the two groups of the to-be-detected data, to obtain the to-be-identified data.

A sampling rate of 50 GSPS may be implemented through the alternative splicing. At this time, the data bit width is 256 bits.

Data is alternately extracted in sequence from the to-be-detected data Data1 [127:0] acquired by the first acquisition unit and the to-be-detected data Data2 [127:0] acquired by the second acquisition unit, to obtain the to-be-identified data Data [255:0].

Data [255:0] represents alternately spliced data with the sampling rate of 50 GSPS. At this time, the data bit width is 256 bits, and a time interval between two consecutive bits of data is 20 ps.

Time-interleaved sampling and alternate splicing are performed on a data channel of the to-be-identified data by using two high-speed transceivers, so that the to-be-identified data with the sampling rate of 50 GSPS may be obtained. At the sampling rate of 50 GSPS, the time interval between every two sampling points is 20 ps. The high-speed transceiver converts high-speed serial data into low-speed parallel data with the bit width of 256 bits at the sampling rate of 50 GSPS.

Time-interleaved sampling and alternate splicing are performed on the data channel by using two high-speed transceivers with 25 GSPS, to implement the sampling rate of 50 GSPS.

S2 The to-be-identified data is processed to obtain normal sampling data, and glitch flag bit data corresponding to the normal sampling data is set.

S201: Equal-interval extraction is performed on the to-be-identified data based on a timing analysis rate, to obtain the normal sampling data.

At this time, the timing analysis rate is set to 3.125 GSPS. Therefore, the data (i.e. the to-be-identified data) with a width of 256 bits acquired at the rate of 50 GSPS should be extracted at 16-fold equal intervals, and the extracted data is stored as the normal sampling data. The normal sampling data is represented as acq_data [15:0], which includes Data [240], Data [224], . . . , Data [32], Data [16], and Data [0].

S202: The glitch flag bit data glitch [15:0] corresponding to the normal sampling data acq_data [15:0] is set.

The glitch flag bit data glitch [0] corresponds to the normal sampling data acq_data [0], and by analogy, until the glitch flag bit data glitch corresponds to the normal sampling data acq_data [15].

S3: A glitch is identified.

S301: End-to-end splicing is performed on the to-be-identified data at a previous sampling moment of a current sampling moment, the to-be-identified data at the current sampling moment, and the to-be-identified data at a next sampling moment of the current sampling moment, to obtain spliced data.

Two transition edges of a glitch pulse may be distributed at two different sampling moments. Therefore, the end-to-end splicing needs to be performed on the high-bit to-be-identified data at the previous sampling moment, the to-be-identified data at the current sampling moment, and the low-bit to-be-identified data (the low-bit data is first acquired by default) at the next sampling moment, in case that no glitch is identified because the two transition edges of the glitch signal are distributed at the two moments.

When S301 is performed, only a last bit of the to-be-identified data at the previous sampling moment of the current sampling moment is taken, and first [the quantity of interval of the equal-interval extraction −1] bits of the to-be-identified data at the next sampling moment of the current sampling moment is taken.

In this embodiment, the to-be-identified data at the previous moment is Data_n [255:0], the to-be-identified data at the current moment is Data_n1 [255:0], the to-be-identified data at the next moment is Data_n2 [255:0], and the spliced data is Datacom [271:0]. Data_n [225] is used as Datacom [0], Data_n1 [255:0] is used as Datacom [256:1], and Data_n2 [14:0] is used as Datacom [271:257]. In this way, the spliced data Datacom [271:0] is obtained.

Only the last bit of the to-be-identified data at the previous sampling moment of the current sampling moment is taken, and the first [the quantity of interval of the equal-interval extraction −1] bits of the to-be-identified data at the next sampling moment of the current sampling moment is taken. A reason is as follows:

This embodiment is taken as an example. Analysis is performed in combination with S302. In Data_n1 [15:0], whether Data_n1 [0] is a transition edge position depends on Data_n [225]. If Data_n is 1 and Data_n1 [0] is 0, Data_n1 [0] is a falling edge position. If Data_n [225] is 0 and Data_n1 [0] is 1, Data_n1 [0] is a rising edge position. Therefore, the transition edge position data at the current moment may be generated by using the highest-bit data Data_n at the previous moment (the highest-bit data is acquired at last by default). Therefore, only one bit is taken from the sampling data at the previous moment. That is, only the last bit is taken from the to-be-identified data at the previous sampling moment of the current sampling moment.

Figure 4:
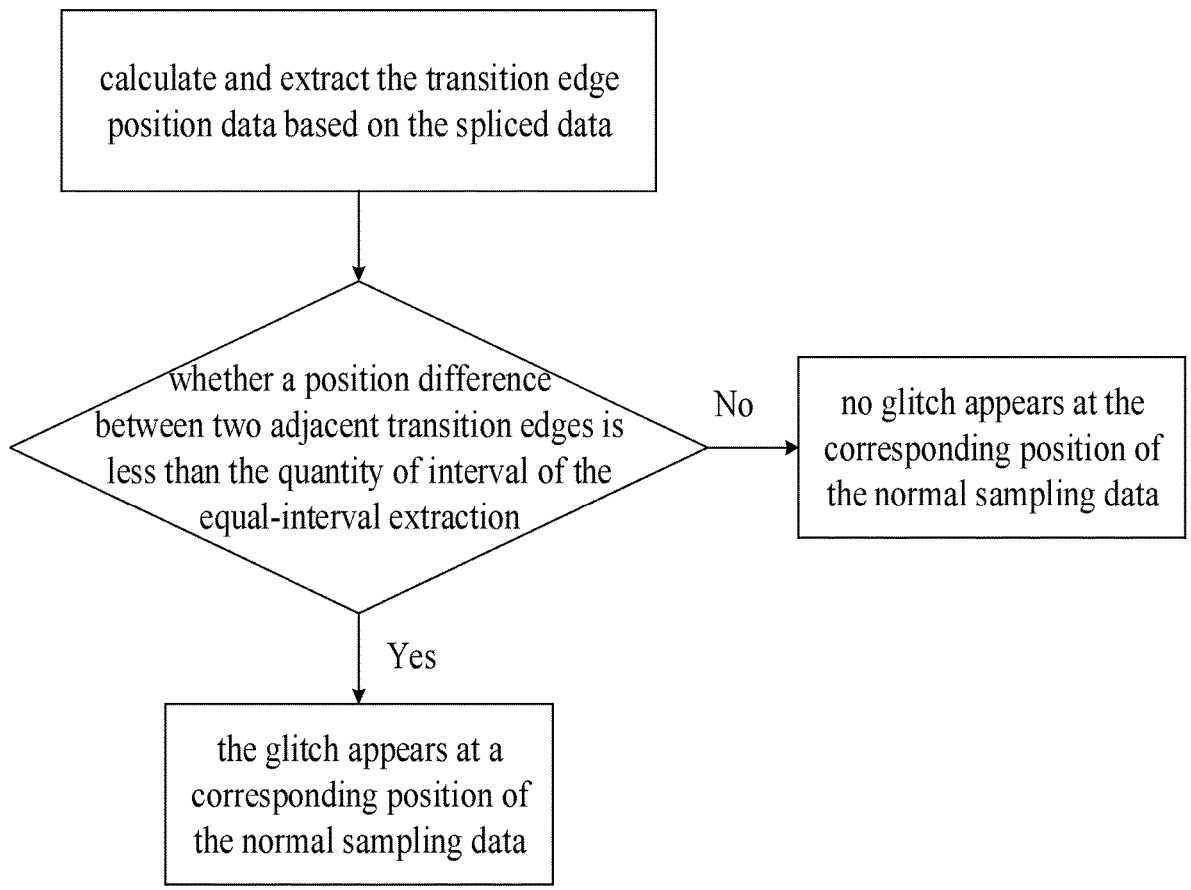
FIG. 4 is a flow diagram of identifying a glitch according to an embodiment of the disclosure.

When whether there is a glitch signal in Data_n1 [255:240] is determined, Data_n1 [255:240] is first converted into transition edge data Edge_n1 [255:240], and then whether two transition edges appear in 16 consecutive bits of data in the transition edge data is determined. A method for determining whether the two transition edges appear is: determining whether there are two transition edges in 16-bit data starting with Edge_n1 [240], determining whether there are two transition edges in 16-bit data starting with Edge_n1 [241], . . . , and determining whether there are two transition edges in 16-bit data starting with Edge_n1 [255]. However, Edge_n1 is the highest-bit data at the current moment. Therefore, when whether there are two transition edge positions in the 16-bit data starting with Edge_n1 is determined, 15-bit data at the next moment is needed. As shown in FIG. 4, S302 includes the following sub-steps:

S302: Transition edge position data is extracted based on the spliced data and the quantity of interval of the equal-interval extraction, and the glitch is identified based on the transition edge position data.

(1) The transition edge position data are calculated and extracted based on the spliced data.

Pairwise exclusive OR operation shown in the following formula is performed on adjacent bits of the spliced data, to obtain the transition edge position data:

$$Edge[i]=Data\_com[i] \oplus Data\_com[i+1],$$

where, Edge [i] represents the transition edge position data.

Edge [i] being 1 represents that a transition edge appears at a corresponding position, and Edge [i] being 0 represents that no transition edge appears at the corresponding position.

The transition edge position data is Edge [270:0].

(2) Based on the transition edge position data, it is determined whether a position difference between two adjacent transition edges is less than the quantity of interval (i.e. the quantity of the currently set sampling interval) of the equal-interval extraction, where if the position difference between the two adjacent transition edges is less than the quantity of interval of the equal-interval extraction, the glitch appears at a corresponding position of the normal sampling data, and the glitch flag bit data at the corresponding position is set to 1 (this is subject to a first transition edge position of a glitch pulse); otherwise, no glitch appears in the normal sampling data at the corresponding position, and the glitch flag bit data at the corresponding position is set to 0.

m is the quantity of interval of the equal-interval extraction, and k is 0, 1, 2 . . . .

If any one group of data among Edge [0+k×m+m−1:0+k×m], Edge [1+k×m+m−1:1+k×m], Edge [2+k×m+m−1:2+k×m], . . . , Edge [m−1+k×m+m−1:m−1+k×m] has two 1s and a lowest bit of the group of data is 1, it indicates that two transition edges appear in m consecutive bits of data. Therefore, there is a glitch pulse in the to-be-identified data Data_n1 [0+k×m+m−1:0+k×m] at the current moment, and the glitch flag bit data glitch [k] corresponding to acq_data [k] is set to 1; otherwise, the glitch flag bit data glitch [k] corresponding to acq_data [k] is set to 0.

In this embodiment, m=16, and a maximum of k is 15.

If any one group of data among Edge [15:0], Edge [16:1], Edge [17:2], . . . , Edge [30:15] has two 1s and a lowest bit of the group of data is 1, glitch [0] is set to 1; otherwise, glitch [0] is set to 0.

Because acq_data [0] is obtained, by the equal-interval extraction, from the to-be-identified data Data_n1 [255:0] at the current moment, when there is glitch data in Data_n1 [15:0], the glitch flag bit data glitch [0] corresponding to acq_data[0] should be set to 1. If there is no glitch data in Data_n1 [15:0], the glitch flag bit data glitch [0] corresponding to acq_data [0] should be set to 0.

If any one group of data among Edge [31:16], Edge [32:17], Edge [33:18], . . . , Edge [46:31] has two 1s and a lowest bit of the group of data is 1, glitch [1] is set to 1; otherwise, glitch [1] is set to 0.

By analogy, if any one group of data among Edge [255:240], Edge [256:241], Edge [257:242], . . . , Edge [270:257] has two 1s and a lowest bit of the group of data is 1, glitch is set to 1; otherwise, glitch is set to 0.

In this way, the glitch flag bit data glitch [15:0] may be obtained.

For the timing analysis rate of 3.125 GSPS, a pulse whose pulse width is less than 320 ps is the glitch pulse. The time interval of two consecutive bits of data is 20 ps. In this way, 16 consecutive bits of data has a total of 15 time intervals with a total duration of 300 ps. Therefore, if there are two transition edge positions in the 16 consecutive bits of data, it indicates that a signal with a pulse width not greater than 300 ps is acquired.

Before glitch determining is performed on the spliced data, the transition edge position data is first extracted. Exclusive OR operation is performed on adjacent bits of the spliced data, to extract the transition edge position data. Whether a time between two transition edges is less than a currently set sampling interval is determined. If the time between the two transition edges is less than the currently set sampling interval, the glitch flag bit data corresponding to the normal sampling data position is set to 1 (this is subject to a first transition edge position of a glitch pulse). If the time between the two transition edges is greater than the currently set sampling interval, the glitch flag bit data corresponding to the normal sampling data position is set to 0.

S4: The normal sampling data and the glitch flag bit data are stored.

During the glitch detection, a storage depth of the data channel is halved, half of the storage space is used to store the normal sampling data, and the other half of the storage space is used to store the corresponding glitch flag bit data. An upper computer reads data from the storage space, displays the normal sampling data in a waveform, and marks the glitch at the normal sampling data corresponding to the glitch flag bit data at the same time.

In this example, at the timing analysis rate of 3.125 GSPS, a narrow pulse with a width of less than 320 ps may be considered as the glitch, and a smallest glitch with a width of 20 ps may be detected.

The acquisition unit samples and processes the data channel, to obtain the to-be-identified data. The to-be-identified data is extracted and stored as the normal sampling data. At the same time, the glitch flag bit data is set in a manner of corresponding to the normal sampling data, and the glitch position is determined based on the to-be-identified data. The normal sampling data and the glitch flag bit data are stored at the same time, and the upper computer reads the normal sampling data and the glitch flag bit data, and marks the glitch on a waveform of the normal sampling data.

A method for implementing ps-level glitch detection at a sampling rate of 50 GSPS by using a high-speed transceiver resource inside an FPGA is provided. At the timing analysis rate of 3.125 GSPS, a narrow pulse with a width of less than 320 ps may be considered as the glitch, and a smallest glitch with a width of 20 ps may be detected, so that the glitch is accurately detected at the high sampling rate.

The foregoing examples merely represent some specific implementations of the present disclosure, and the description thereof is relatively specific and detailed, but these examples should not be construed as limiting the patent scope of the present disclosure. It should be noted that those of ordinary skill in the art can further make several variations and improvements without departing from the idea of the present disclosure, but such variations and improvements shall all fall within the protection scope of the present disclosure.

Various embodiments of the disclosure may have one or more of the following beneficial effects. In some embodiments, the disclosure may overcome the disadvantage of the conventional art by providing a method and system for detecting a glitch at a high sampling rate and by accurately detecting the glitch at the high sampling rate.

Many different arrangements of the various components depicted, as well as components not shown, are possible without departing from the spirit and scope of the present disclosure. Embodiments of the present disclosure have been described with the intent to be illustrative rather than restrictive. Alternative embodiments will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Unless indicated otherwise, not all steps listed in the various figures need be carried out in the specific order described.

The disclosure claimed is:

1. A method for detecting a glitch at a high sampling rate, comprising the steps of:
   acquiring to-be-identified data;
   processing the to-be-identified data to obtain normal sampling data; and
   performing glitch identification on the to-be-identified data to obtain a glitch position of the normal sampling data;
   wherein the step of performing the glitch identification comprises the steps of:
      performing end-to-end splicing on the to-be-identified data at a previous sampling moment of a current sampling moment, the to-be-identified data at the current sampling moment, and the to-be-identified data at a next sampling moment of the current sampling moment to obtain spliced data; and
      extracting transition edge position data based on the spliced data and a quantity of interval of an equal-interval extraction, and identifying the glitch based on the transition edge position data.

2. The method according to claim 1, wherein the step of processing the to-be-identified data comprises:
   performing equal-interval extraction on the to-be-identified data based on a timing analysis rate to obtain the normal sampling data.

3. The method according to claim 1, wherein the step of performing the end-to-end splicing comprises:
   taking only a last bit of the to-be-identified data at the previous sampling moment of the current sampling moment; and
   taking the quantity of interval of the equal-interval extraction minus one bit of the to-be-identified data at the next sampling moment of the current sampling moment.

4. The method according to claim 1, wherein the step of extracting the transition edge position data comprises:
   (1) calculating and extracting the transition edge position data based on the spliced data; and
   (2) determining, based on the transition edge position data, whether a position difference between two adjacent transition edges is less than the quantity of interval of the equal-interval extraction, wherein:
      if the position difference between the two adjacent transition edges is less than the quantity of interval of the equal-interval extraction, the glitch appears at a corresponding position of the normal sampling data, and the glitch is subject to a first transition edge position of a glitch pulse; and
      otherwise, no glitch appears at the corresponding position of the normal sampling data.

5. The method according to claim 4, wherein in step (1), pairwise exclusive OR operation shown in the following formula is performed on adjacent bits of the spliced data to obtain the transition edge position data:

$$\text{Edge}[i] = \text{Data\_com}[i] \oplus \text{Data\_com}[i+1],$$

wherein:
Edge [i] represents a set of the transition edge position data, Edge [i] being 1 represents that a transition edge appears at the corresponding position of the normal sampling data, and Edge [i] being 0 represents that no transition edge appears at the corresponding position of the normal sampling data;

Data_com [i] represents a set of the spliced data; and

Data_com [i+1] represents another set of the spliced data.

6. The method according to claim 5, wherein in step (2), the step of determining whether the position difference between two adjacent transition edges is less than the quantity of interval of the equal-interval extraction is conducted by using a determining criterion such that any one group of data among Edge [0+k×m+m−1:0+k×m], Edge [1+k×m+m−1:1+k×m], Edge [2+k×m+m−1:2+k×m], . . . , Edge [m−1+k×m+m−1:m−1+k×m] among the transition edge position data Edge [i] has two 1s and a lowest bit in the group of data is 1, wherein m is the quantity of interval of the equal-interval extraction and k is an integer selected from the group consisting of 0, 1, 2, . . . .

7. The method according to claim 1, wherein the step of acquiring the to-be-identified data comprises:

performing time-interleaved sampling on a data channel of the to-be-identified data by two acquisition units to obtain two groups of to-be-detected data; and performing alternative splicing on the two groups of the to-be-detected data to obtain the to-be-identified data.

8. The method according to claim 7, wherein:

the two acquisition units comprise a first acquisition unit and a second acquisition unit; and a quadrature phase of a reference clock of the second acquisition unit is greater than that of the first acquisition unit by 180°.

9. The method according to claim 3, wherein the step of extracting the transition edge position data comprises:

(1) calculating and extracting the transition edge position data based on the spliced data; and (2) determining, based on the transition edge position data, whether a position difference between two adjacent transition edges is less than the quantity of interval of the equal-interval extraction, wherein:

if the position difference between the two adjacent transition edges is less than the quantity of interval of the equal-interval extraction, the glitch appears at a corresponding position of the normal sampling data, and the glitch is subject to a first transition edge position of a glitch pulse; and otherwise, no glitch appears at the corresponding position of the normal sampling data.

10. The method according to claim 9, wherein in step (1), pairwise exclusive OR operation shown in the following formula is performed on adjacent bits of the spliced data to obtain the transition edge position data:

Edge[i]=Data_com[i]⊕Data_com[i+1], wherein:

Edge [i] represents a set of the transition edge position data, Edge [i] being 1 represents that a transition edge appears at the corresponding position of the normal sampling data, and Edge [i] being 0 represents that no transition edge appears at the corresponding position of the normal sampling data;

Data_com [i] represents a set of the spliced data; and

Data_com [i+1] represents another set of the spliced data.

11. The method according to claim 10, wherein in step (2), the step of determining whether the position difference between two adjacent transition edges is less than the quantity of interval of the equal-interval extraction is conducted by using a determining criterion such that any one group of data among Edge [0+k×m+m−1:0+k×m], Edge [1+k×m+m−1:1+k×m], Edge [2+k×m+m−1:2+k×m], . . . , Edge [m−1+k×m+m−1:m−1+k×m] among the transition edge position data Edge [i] has two 1s and a lowest bit in the group of data is 1, wherein m is the quantity of interval of the equal-interval extraction and k is an integer selected from the group consisting of 0, 1, 2, . . . .

12. A method for detecting a glitch at a high sampling rate, comprising the steps of:

acquiring to-be-identified data;

processing the to-be-identified data to obtain normal sampling data; and performing glitch identification on the to-be-identified data to obtain a glitch position of the normal sampling data;

wherein the step of acquiring the to-be-identified data comprises:

performing time-interleaved sampling on a data channel of the to-be-identified data by two acquisition units to obtain two groups of to-be-detected data; and performing alternative splicing on the two groups of the to-be-detected data to obtain the to-be-identified data.

13. The method according to claim 12, wherein:

the two acquisition units comprise a first acquisition unit and a second acquisition unit; and a quadrature phase of a reference clock of the second acquisition unit is greater than that of the first acquisition unit by 180°.

* * * * *